United States Patent
Kang et al.

(10) Patent No.: US 7,436,693 B2
(45) Date of Patent: Oct. 14, 2008

(54) PHASE-CHANGE SEMICONDUCTOR MEMORY DEVICE AND METHOD OF PROGRAMMING THE SAME

(75) Inventors: Sang-beom Kang, Hwaseong-si (KR); Du-eung Kim, Yongin-si (KR); Hyung-rok Oh, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/319,372

(22) Filed: Dec. 29, 2005

(65) Prior Publication Data

US 2006/0220071 A1 Oct. 5, 2006

(30) Foreign Application Priority Data

Apr. 4, 2005 (KR) .................... 10-2005-0028087

(51) Int. Cl.
*G11C 11/00* (2006.01)
(52) U.S. Cl. ........................................... 365/148
(58) Field of Classification Search ................ 365/148
See application file for complete search history.

(56) References Cited

U.S. PATENT DOCUMENTS 6,480,438 B1 11/2002 Park
6,487,113 B1* 11/2002 Park et al. ................. 365/163
6,625,054 B2 9/2003 Lowrey et al.
6,754,107 B2* 6/2004 Khouri et al. .......... 365/185.23
6,809,401 B2 10/2004 Nishihara et al.
7,082,051 B2* 7/2006 Ha et al. ................... 365/163
7,203,087 B2* 4/2007 Resta et al. ................ 365/148
2003/0002332 A1 1/2003 Lowrey
2004/0246804 A1* 12/2004 Cho et al. ................. 365/225.7
2005/0185572 A1* 8/2005 Resta et al. ................ 370/205

FOREIGN PATENT DOCUMENTS

KR 1020050017352 A 2/2005

* cited by examiner

*Primary Examiner*—Hoai V. Ho
*Assistant Examiner*—Anthan T Tran
(74) *Attorney, Agent, or Firm*—Volentine & Whitt, PLLC

(57) ABSTRACT

In one aspect, a semiconductor memory device includes a plurality of phase-change memory cells which are programmed according to a write current applied to the phase-change memory cells, a voltage boosting circuit which receives a first voltage and outputs a boosted voltage which is greater than the first voltage, and a write driver which receives the boosted voltage and which generates the write current from the boosted voltage. In another aspect, the write driver generates the write current corresponding to one of a set current pulse and a reset current pulse, and at least one of the set current pulse and the reset current pulse is gradually increased.

6 Claims, 5 Drawing Sheets

PHASE-CHANGE SEMICONDUCTOR MEMORY DEVICE AND METHOD OF PROGRAMMING THE SAME

BACKGROUND OF THE INVENTION

1. Field of the Invention

The present invention relates to semiconductor memory devices, and more particularly, the present invention relates phase-change semiconductor memory devices and to methods of programming phase-change semiconductor memory devices.

A claim of priority is made to Korean Patent Application No. 10-2005-0028087, filed on Apr. 4, 2005, in the Korean Intellectual Property Office, the disclosure of which is incorporated herein in its entirety by reference.

2. Description of the Related Art

A phase-change random access memory (PRAM), also known as an Ovonic Unified Memory (OUM), includes a phase-change material such as a chalcogenide alloy which is responsive to heat so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to a 'set' state and is designated logic "0", while the high-resistance amorphous state is referred to as a 'reset' state and is designated logic "1".

Generally, the phase-change material of a PRAM is reset to an amorphous state by heating the material in excess of its melting point temperature for a relatively short period of time. On the other hand, the phase-change material is set to a crystalline state by heating the material below its melting point temperature for a longer period of time.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

In addition to the differing resistive characteristics mentioned above, the phase-change material exhibits a relatively low reflexibility in its amorphous state, and a relatively high reflexibility in its crystalline state.

FIGS. 1A and 1B illustrate a memory cell 10 in a 'set' state and in a 'reset' state, respectively, and FIG. 2 is an equivalent circuit diagram of the memory cell 10 of FIGS. 1A and 1B. It should be noted that the connections illustrated in FIGS. 1A, 1B and 2 are presented as examples only, and that other configurations are possible. For example, the cell C (FIG. 2) may include a phase-change material connected to the bit line BL, and a diode (not shown) connected between the phase-change material and the word line WL.

In each of FIGS. 1A and 1B, the memory cell 10 includes a top electrode 12 formed on a phase-change material 14. In this example, the top electrode 12 is electrically connected to a bit line BL of a PRAM memory array (not shown). A conductive bottom electrode contact (BEC) 16 is formed between the phase-change material 14 and a conductive bottom electrode 18. An access transistor 20 is electrically connected between the bottom electrode 18 and a reference potential (e.g., ground). In this example, the gate of the access transistor 20 is electrically connected to a word line WL of the PRAM cell array (not shown).

In FIG. 1A, the phase-change material is illustrated as being in its crystalline state. As mentioned previously, this means that the memory cell 10 is in a low-resistance 'set' state or logic 0 state. In FIG. 1B, a portion of the phase-change material is illustrated as being amorphous. Again, this means that the memory cell 10 is in a high-resistance 'reset' state or logic 1 state.

The set and reset states of the memory cell 10 of FIGS. 1A and 1B are establish by controlling the magnitude and duration of current flow through the BEC 16. That is, as shown in FIG. 2, the cell C is activated (or accessed) by operation of the access transistor 20 which is responsive to a voltage of the word line WL. When activated, the cell C is programmed according to the voltage of the bit line BL. More specifically, the bit line BL voltage is controlled to establish a programming current ICELL which causes the BEC 16 to act as a resistive heater which selectively programs the phase-change material 14 in its 'set' and 'reset' states. This is explained in more detail below with reference to FIG. 3.

FIG. 3 illustrates an example of temperature pulse characteristics of phase-change material as the phase-change material is programmed in the 'set' and 'reset' states. In particular, reference number 35 denotes the temperature pulse of the phase-change material programmed to its 'reset' state, and reference number 36 denotes the temperature pulse of the phase-change material programmed to its 'set' state.

As shown in FIG. 3, when the phase-change material is programmed to its 'reset' state, the temperature of the material is increased above its melting temperature Tm (e.g., 610° C.) for a relatively short period of time, and then allowed to rapidly cool. In contrast, when the phase-change material is programmed to its 'set' state, the temperature of the material is increased to below its melting point Tm and above its crystallizing temperature Tx (e.g., 450° C.) for a longer period of time, and then allowed to cool. The temperature range between the melting temperature Tm and the crystallizing temperature Tx is referred to as the "set window".

FIG. 4 is a diagram showing a set current pulse I_SET and a reset current pulse I_RESET that is applied to the phase-change memory cell in order to achieve the temperature pulse characteristics shown in FIG. 3. More particularly, the reset current pulse I_RESET is applied to achieve the temperature pulse 35 of FIG. 3, and the set current pulse I_SET is applied to achieve the temperature pulse 36 of FIG. 3. As one would expect, a larger current pulse of shorter duration is applied to place the phase-change material in its amorphous state than in its crystallize state.

As the operational voltage level of portable devices continues to decrease, it has become increasingly difficult to generate sufficient PRAM programming currents from the power supplies of such devices. That is, if the power supply of the PRAM memory device generates low voltage power supply signal (e.g., about 1.8 V), the write current may be insufficient as the result of one or several excessive voltage drops in the write circuit path.

Moreover, another problem can arise when the reset or set operation is performed in a multi-bit cell format, e.g., a×16-bit format. The accumulative current that is drawn into the memory cells can cause fluctuations in the voltage level of the power supply each time a writing operation is performed.

SUMMARY OF THE INVENTION

According to an aspect of the present invention, a semiconductor memory device is provided which includes a plurality of phase-change memory cells which are programmed according to a write current applied to the phase-change memory cells, a voltage boosting circuit which receives a first voltage and outputs a boosted voltage which is greater than the first voltage, and a write driver which receives the boosted voltage and which generates the write current from the boosted voltage.

According to another aspect of the present invention, a method of programming memory cells is provided, where the memory cells each include a phase-change material which is responsive to a write current to be selectively programmed into one of at least two states. The method includes selectively generating one of a set current pulse and a reset current pulse, wherein a magnitude of at least one of the set current pulse and the reset current pulse is gradually increased, and generating the write current corresponding to the set current pulse to program the phase-change material into a first state, and generating the write current corresponding to the reset current pulse to program the phase-change material into a second state.

According to yet another aspect of the present invention, a semiconductor memory device is provide which includes a memory cell array including memory cells which store data in response to a write current, and a write driver which generates the write current from a boosted voltage and applies the write current to the memory cells in response to a set current pulse or reset current pulse.

BRIEF DESCRIPTION OF THE DRAWINGS

The above and other features and advantages of the present invention will become readily apparent from the detailed description that follows, with reference to the accompanying drawings, in which.

DETAILED DESCRIPTION OF PREFERRED EMBODIMENTS

Figure 1A:
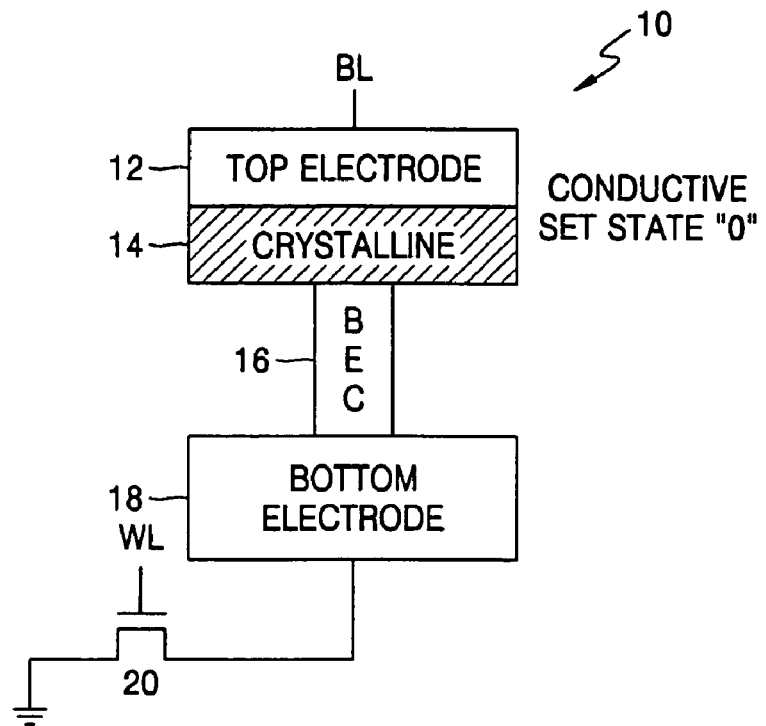
FIGS. 1A and 1B illustrate a memory cell in a 'set' state and in a 'reset' state, respectively.
Figure 1B:
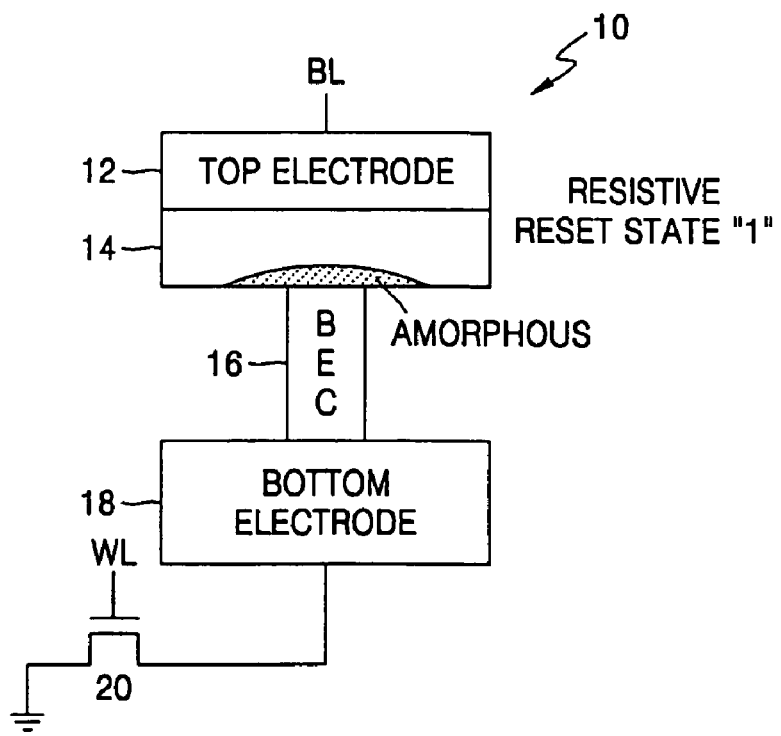
Figure 2:
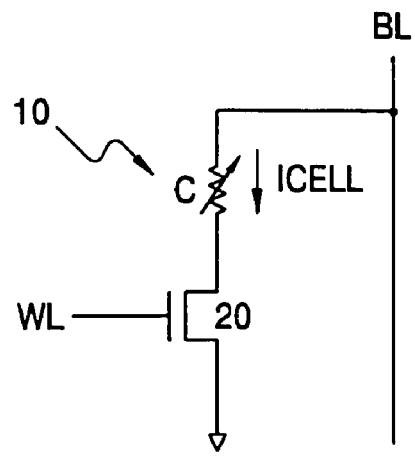
FIG. 2 is a diagram illustrating a circuit representation of the memory cell of FIG. 1.
Figure 3:
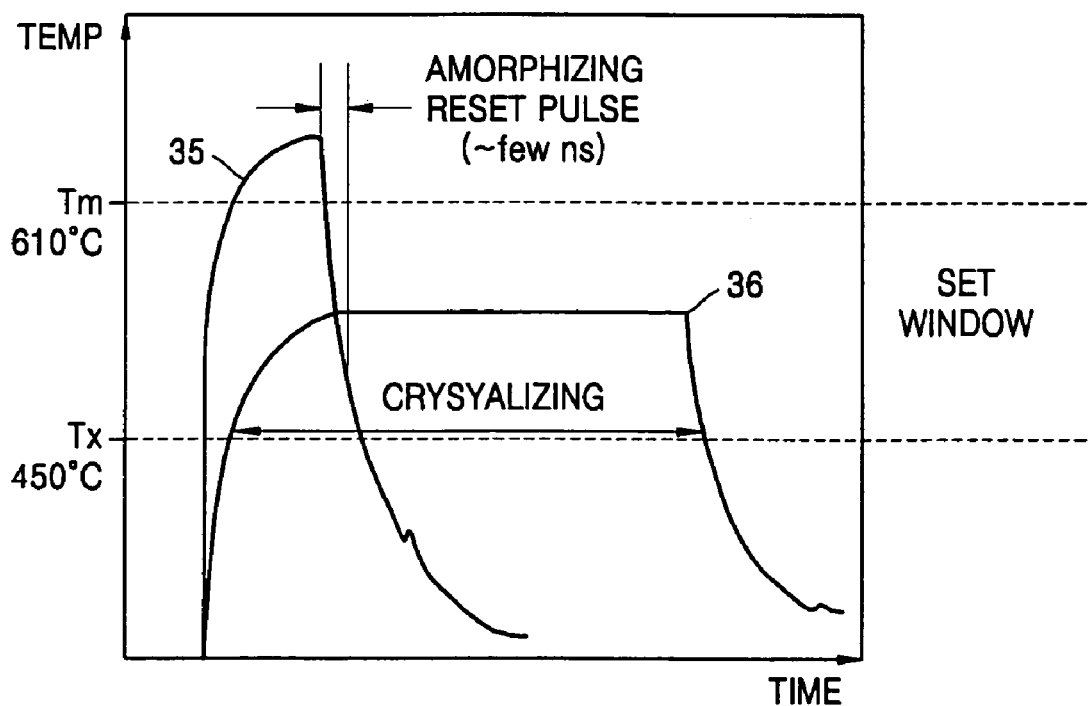
FIG. 3 is a graph illustrating temperature characteristics of a phase-change memory cell during programming of the memory cell.
Figure 4:
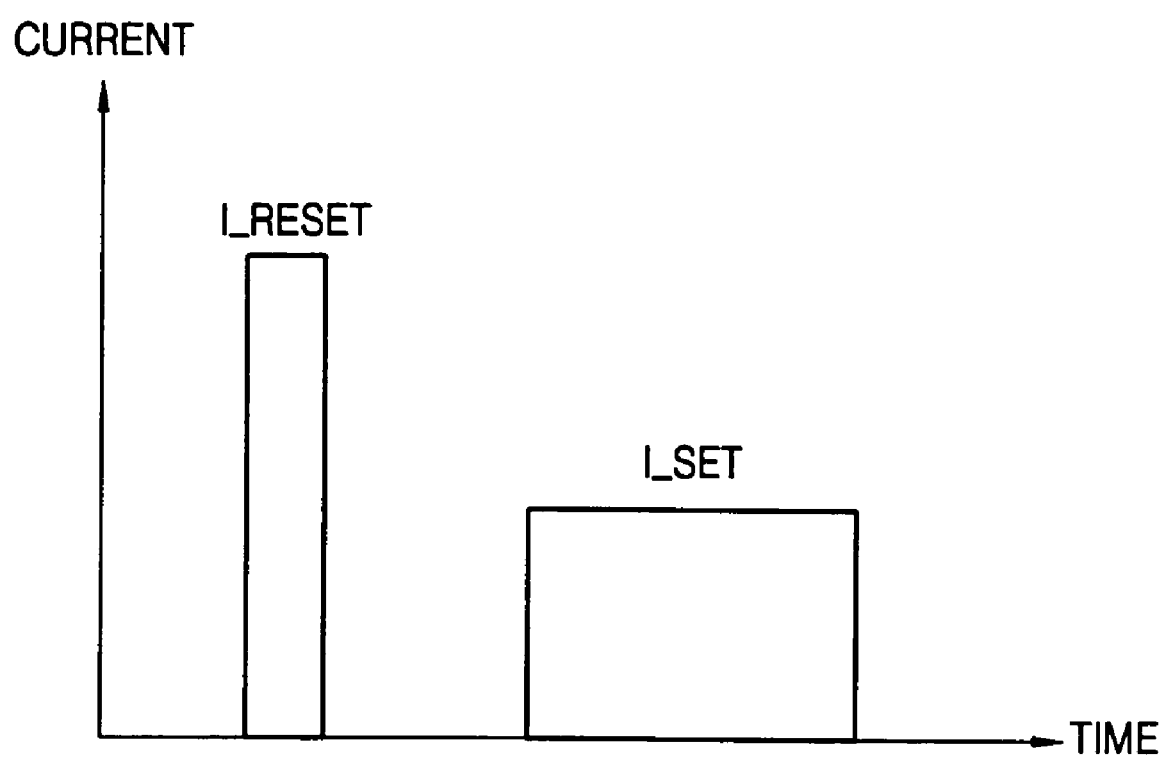
FIG. 4 is a diagram showing a set current pulse and a reset current pulse which are utilized to obtain the temperature characteristics shown in FIG. 3.
Figure 5:
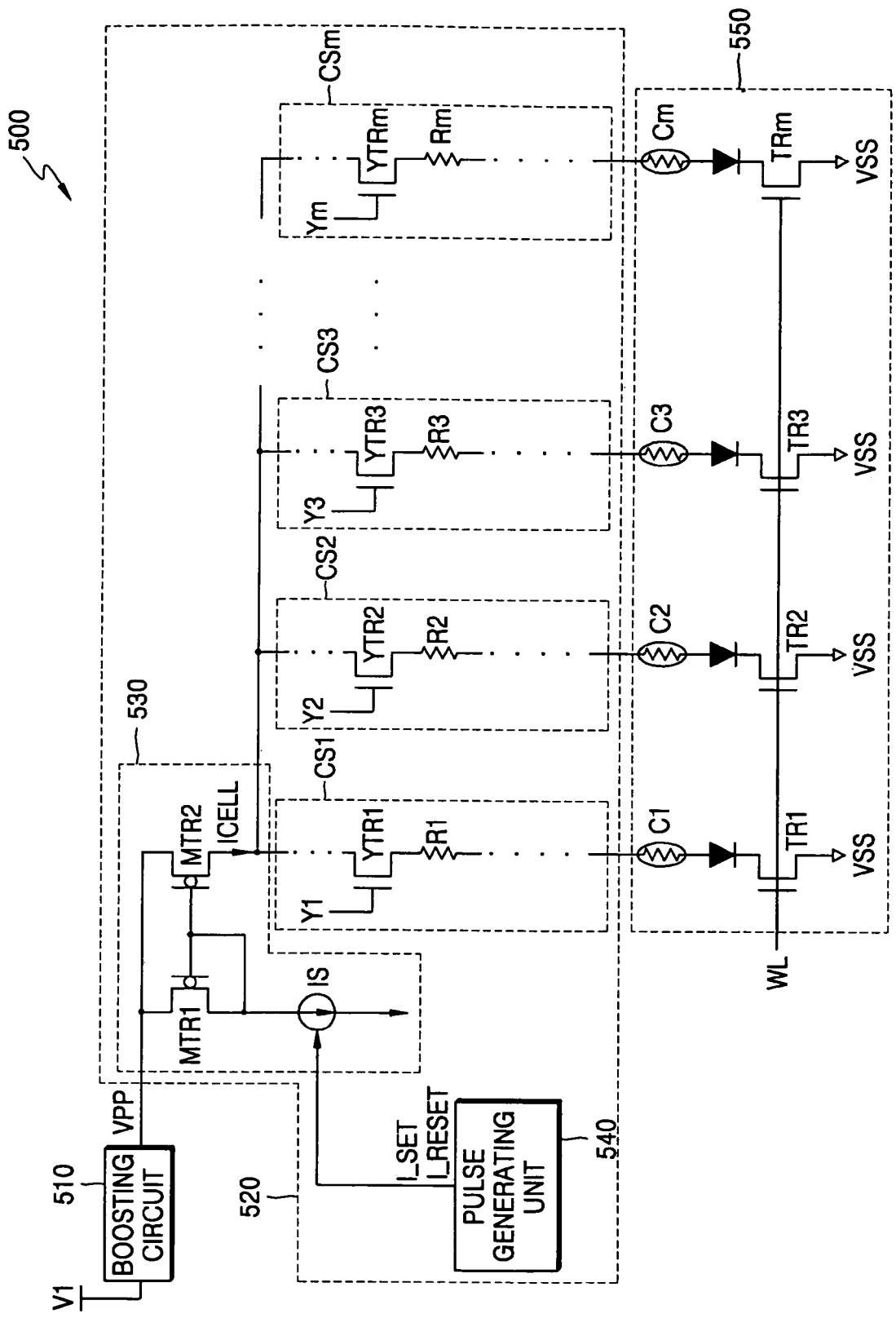
FIG. 5 is a circuit diagram of a phase-change semiconductor memory device according to an embodiment of the present invention.

Hereinafter, exemplary embodiments of the present invention will be described in detail with reference to the accompanying drawings. The drawings are for illustrative purposes only, and are not intended to limit the scope of the invention. FIG. 5 is a circuit diagram of a phase-change semiconductor memory device 500 according to an embodiment of the present invention.

Referring to FIG. 5, the semiconductor memory device 500 of the illustrated example includes a boosting circuit 510, a write driver 520, and a memory cell array 550.

The boosting circuit 510 outputs a boosted voltage VPP which is of a higher voltage than an input first voltage V1. The structural configurations of circuits which can function as the boosting circuit 510 are well understood by those skilled in the art, and accordingly, a detailed description thereof is omitted here.

The memory cell array 550 of this example includes a plurality of phase-change memory cells C1-Cm, diodes D1-Dm, and access transistors TR1-TRm, respectively connected in series between the write driver 520 and a reference voltage VSS. The access transistors TR1-TRm are gated to a word line WL of the memory device 500. The phase change memory cells C1-Cm of this example are each composed of a phase-change material which includes germanium (Ge), antimony (Sb), and tellurium (Te) (e.g., $Ge_2Sb_2Te_5$ or GST). However, the invention is not limited by the choice of phase-change material.

The write driver 520 of this example includes a pulse generating circuit 540, a plurality of column selection circuits CS1-CSm, and a current mirror 530 which includes a current supply IS and transistors MTR1 and MTR2. As shown, the pulse generating circuit 540 controls the current supply IS of the current mirror 530 to generate either a 'set' current pulse I_SET or a 'reset' current pulse I_RESET, which is reflected as a write current ICELL output from the current mirror 530. The structural configurations of circuits which can function as the pulse generating circuit 540 are well understood by those skilled in the art, and accordingly, a detailed description thereof is omitted here.

The column selection circuits CS1-CSm include column select transistors YTR1-YTRm and resistive elements R1-Rm connected in series between the output of the current mirror 530 and the respective phase-change memory cells C1-Cm. The column select transistors YTR1-YTRm are gated to column selection signals Y1-Ym. As an operational example, assume that the word line WL is active, thus activating the transistors TR1-TRm of the memory cell array 550. In this state, when the first column transistor YTR1 is turned on by activating the first column selecting signal Y1, the column selecting unit CS1 applies the write current ICELL to the corresponding memory cell C1 in the memory cell array 550. The write current ICELL changes the state of the phase-change material of the memory cell C1 to a crystalline state or an amorphous state.

As described above, the first voltage V1 is voltage-level boosted by the boosting circuit 510 to output the boost voltage VPP. The first voltage V1 may be a power supply voltage of the memory device, or some other voltage within the memory device.

The boost voltage VPP generated by boosting circuit 510 acts as a power source to drive the write driver 520. As such, the increased magnitude of the boost voltage VPP is reflected as an increased write current ICELL which is sufficiently large to reliably program the memory cells C1-Cm. Accordingly, the boosting circuit 510 can be effectively utilized to overcome the problem encountered in conventional systems in which the write current may be insufficient as the result of a low power supply voltage and one or several excessive voltage drops in the write circuit path.

Figure 6A:
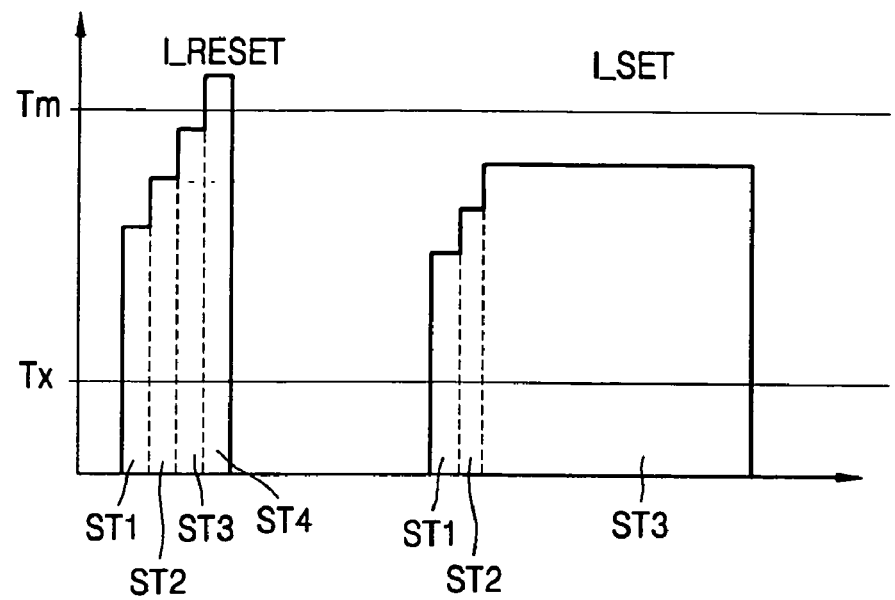
FIGS. 6A and 6B illustrate waveforms of a set current pulse and a reset current pulse according to an embodiment of the present invention.
Figure 6B:
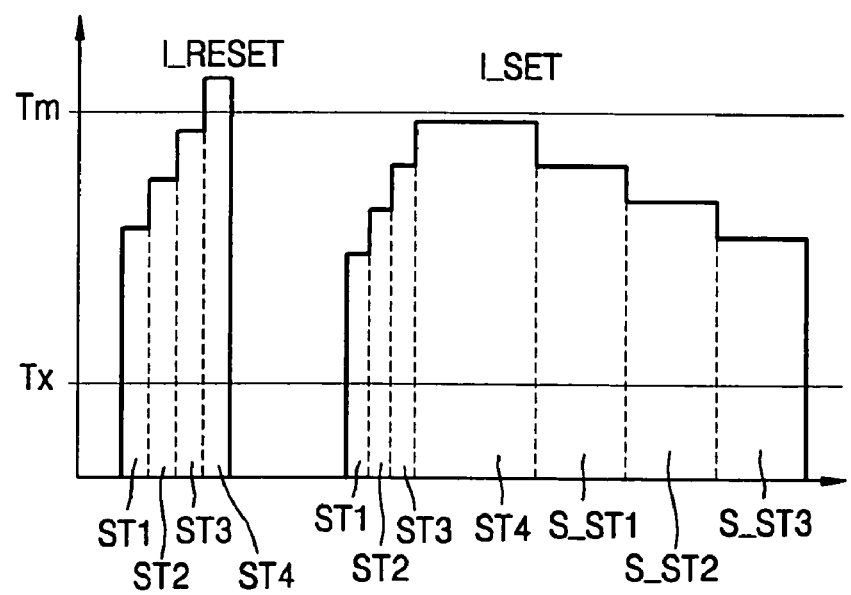

Another embodiment of the invention will now be described with reference to FIGS. 6A and 6B. In particular, FIGS. 6A and 6B illustrate examples of set current (I_SET) and reset current (I_RESET) pulse waveforms of this embodiment of the invention. When implemented for example in the embodiment of FIG. 5, these pulse waveforms are output from the pulse generating circuit 540 to control the current source IS of the current mirror 530. As such, a write current ICELL is generated from the current mirror 530 which corresponds to the set current (I_SET) and reset current (I_RESET) pulse waveforms.

As shown in FIGS. 6A and 6B, the set current pulse I_SET and reset current pulse I_RESET include a plurality of stages such that magnitudes of the set current pulse I_SET and reset current pulse I_RESET are sequentially or gradually increased. The write current ICELL generated from the current mirror 530 is therefore sequentially or gradually increased in correspondence with the set current pulse I_SET and reset current pulse I_RESET.

In particular, in the example of FIG. 6A, the reset current pulse I_RESET is step-increased in four stages ST1-ST4, where the final stage ST4 exceeds the melting point temperature Tm of the phase-change material. The set current pulse I_SET is step-increased in three stages ST1-ST3 within the set window between temperatures Tm and Tx.

In the example of FIG. 6B, the reset current pulse I_RESET is step-increased in four stages ST1-ST4, where the final stage ST4 exceeds the melting point temperature Tm of the phase-change material. The set current pulse I_SET is step-increased in four stages ST1-ST4 within the set window between temperatures Tm and Tx, and then step-decreased in three stages S_ST1-S_ST3.

It is noted that the waveforms illustrated in FIGS. 6A and 6B are presented as examples only. The invention is not limited to the particular numbers of stages illustrated in these figures, nor is the invention limited to the relative durations of each stage as illustrated in these figures. In addition, as one skilled in the art will appreciate, the invention is not limited to rectangular pulse signals.

The sequential or gradual increase in the set current pulse I_SET and reset current pulse I_RESET is effective in reducing fluctuations in the voltage level of the power supply (or the boost voltage VPP) each time a writing operation is performed with respect to multiple memory cells. That is, by sequentially or gradually increasing the set current pulse I_SET and the reset current pulse I_RESET, the rapid consumption of a large amount of current is avoided, and fluctuations of the power supply (or the boost voltage VPP) can be reduced.

Further, referring to FIG. 6B in particular, the gradual reduction of the set current pulse I_SET allows for memory cells C1-Cm having various current values to be stably programmed into the set state. Such an operation of the set current pulse I_SET is also known as a low quench scheme.

As described above, in a phase-change semiconductor memory device and a method of programming the phase-change semiconductor memory device according to embodiments of the present invention, a write current is supplied to memory cells using a boost voltage to stabilize the write driver operation.

As also described above, in a phase-change semiconductor memory device and a method of programming the phase-change semiconductor memory device according to embodiments of the present invention, the write current magnitude is gradually increased during programming to minimize voltage source fluctuations.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device, comprising:
a plurality of phase-change memory cells which are programmed according to a write current applied to the phase-change memory cells;
a voltage boosting circuit which receives a first voltage and outputs a boosted voltage which is greater than the first voltage; and
a write driver which receives the boosted voltage and which generates the write current from the boosted voltage;
wherein the write driver generates the write current corresponding to one of a set current pulse and a reset current pulse, and wherein the set current pulse and the reset current pulse are step-increased in a plurality of stages.

2. The semiconductor memory device of claim 1, wherein the set current pulse is step-decreased in a plurality of stages after being step-increased in a plurality of stages.

3. The semiconductor memory device of claim 2, wherein the write current programs the memory cells into a crystalline state in response to the set current pulse, and programs the memory cells into an amorphous state in response to the reset current pulse.

4. The semiconductor memory device of claim 1,
wherein the write driver includes a current mirror unit which is driven by the boosted voltage and generates the write current in accordance with a supply current.

5. The semiconductor memory device of claim 1, wherein the first voltage is a power supply voltage.

6. The semiconductor memory device of claim 1, wherein a phase-change material of each of the phase-change memory cells is comprised of germanium (Ge), antimony (Sb) and tellurium (Te).

* * * * *